(12) United States Patent
D'Evelyn et al.

(10) Patent No.: US 8,492,185 B1
(45) Date of Patent: Jul. 23, 2013

(54) LARGE AREA NONPOLAR OR SEMIPOLAR GALLIUM AND NITROGEN CONTAINING SUBSTRATE AND RESULTING DEVICES

(75) Inventors: Mark P. D'Evelyn, Goleta, CA (US); James Speck, Goleta, CA (US); William Houck, Fremont, CA (US); Mathew Schmidt, Fremont, CA (US); Arpan Chakraborty, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/548,931

(22) Filed: Jul. 13, 2012

Related U.S. Application Data

(60) Provisional application No. 61/507,829, filed on Jul. 14, 2011.

(51) Int. Cl.
*H01L 21/00* (2006.01)
(52) U.S. Cl.
USPC .......... 438/36; 438/22; 438/26; 438/46; 438/47; 438/604; 257/E21.121
(58) Field of Classification Search
None
See application file for complete search history.

(56) References Cited

U.S. PATENT DOCUMENTS

| | | |
|---|---|---|
| 6,398,867 B1 | 6/2002 | D'Evelyn et al. |
| 6,533,874 B1 | 3/2003 | Vaudo et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,858,882 B2 | 2/2005 | Tsuda et al. |
| 6,861,130 B2 | 3/2005 | D'Evelyn et al. |
| 7,001,577 B2 | 2/2006 | Zimmerman et al. |
| 7,012,279 B2 | 3/2006 | Wierer, Jr. et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |

(Continued)

FOREIGN PATENT DOCUMENTS

| | | |
|---|---|---|
| JP | 2005-289797 | 10/2005 |
| WO | 2006/057463 | 6/2006 |
| WO | WO2007-004495 | 1/2007 |
| WO | WO2012-016033 | 2/2012 |

OTHER PUBLICATIONS

D'Evelyn et al., 'Bulk GaN Crystal Growth by The High-Pressure Ammonothermal Method,' Journal of Crystal Growth, vol. 300, 2007, pp. 11-16.

(Continued)

*Primary Examiner* — Kyoung Lee
(74) *Attorney, Agent, or Firm* — Kilpatrick Townsend & Stockton LLP

(57) ABSTRACT

A method for fabricating large-area nonpolar or semipolar GaN wafers with high quality, low stacking fault density, and relatively low dislocation density is described. The wafers are useful as seed crystals for subsequent bulk growth or as substrates for LEDs and laser diodes.

20 Claims, 18 Drawing Sheets

U.S. PATENT DOCUMENTS

| | | | |
|---|---|---|---|
| 7,125,453 | B2 | 10/2006 | D'Evelyn et al. |
| 7,160,531 | B1 | 1/2007 | Jacques et al. |
| 7,175,704 | B2 | 2/2007 | D'Evelyn et al. |
| 7,198,671 | B2 | 4/2007 | Ueda |
| 7,252,712 | B2 | 8/2007 | Dwilinski et al. |
| 7,285,801 | B2 | 10/2007 | Eliashevich et al. |
| 7,316,746 | B2 | 1/2008 | D'Evelyn et al. |
| 7,368,015 | B2 | 5/2008 | D'Evelyn et al. |
| 7,420,261 | B2 | 9/2008 | Dwilinski et al. |
| 7,569,206 | B2 | 8/2009 | Spencer et al. |
| 7,625,446 | B2 | 12/2009 | D'Evelyn et al. |
| 7,642,122 | B2 | 1/2010 | Tysoe et al. |
| 7,704,324 | B2 | 4/2010 | D'Evelyn et al. |
| 7,705,276 | B2 | 4/2010 | Giddings et al. |
| 7,759,710 | B1 | 7/2010 | Chiu et al. |
| 7,871,839 | B2 | 1/2011 | Lee et al. |
| 7,976,630 | B2 | 7/2011 | Poblenz et al. |
| 8,021,481 | B2 | 9/2011 | D'Evelyn |
| 8,048,225 | B2 | 11/2011 | Poblenz et al. |
| 8,097,081 | B2 | 1/2012 | D'Evelyn |
| 8,148,801 | B2 | 4/2012 | D'Evelyn |
| 8,188,504 | B2 | 5/2012 | Lee |
| 8,198,643 | B2 | 6/2012 | Lee et al. |
| 8,207,548 | B2 | 6/2012 | Nagai |
| 8,278,656 | B2 | 10/2012 | Mattmann et al. |
| 8,284,810 | B1 | 10/2012 | Sharma et al. |
| 8,299,473 | B1 | 10/2012 | D'Evelyn et al. |
| 8,303,710 | B2 | 11/2012 | D'Evelyn |
| 8,306,081 | B1 | 11/2012 | Schmidt et al. |
| 8,323,405 | B2 | 12/2012 | D'Evelyn |
| 8,329,511 | B2 | 12/2012 | D'Evelyn |
| 8,354,679 | B1 | 1/2013 | D'Evelyn et al. |
| 2001/0009134 | A1 | 7/2001 | Kim et al. |
| 2001/0048114 | A1 | 12/2001 | Morita et al. |
| 2002/0070416 | A1 | 6/2002 | Morse et al. |
| 2002/0105986 | A1 | 8/2002 | Yamasaki |
| 2002/0182768 | A1 | 12/2002 | Morse et al. |
| 2002/0189532 | A1 | 12/2002 | Motoki et al. |
| 2003/0140845 | A1 | 7/2003 | D'Evelyn et al. |
| 2003/0164507 | A1 | 9/2003 | Edmond et al. |
| 2003/0183155 | A1 | 10/2003 | D'Evelyn et al. |
| 2003/0209191 | A1 | 11/2003 | Purdy |
| 2003/0232512 | A1 | 12/2003 | Dickinson et al. |
| 2004/0000266 | A1 | 1/2004 | D'Evelyn et al. |
| 2004/0023427 | A1 | 2/2004 | Chua et al. |
| 2004/0124435 | A1 | 7/2004 | D'Evelyn et al. |
| 2004/0161222 | A1 | 8/2004 | Niida et al. |
| 2005/0087753 | A1 | 4/2005 | D'Evelyn et al. |
| 2005/0098095 | A1 | 5/2005 | D'Evelyn et al. |
| 2005/0109240 | A1 | 5/2005 | Maeta et al. |
| 2005/0121679 | A1 | 6/2005 | Nagahama et al. |
| 2005/0128469 | A1 | 6/2005 | Hall et al. |
| 2005/0152820 | A1 | 7/2005 | D'Evelyn et al. |
| 2005/0167680 | A1 | 8/2005 | Shei et al. |
| 2005/0205215 | A1 | 9/2005 | Giddings et al. |
| 2005/0263791 | A1 | 12/2005 | Yanagihara et al. |
| 2006/0032428 | A1 | 2/2006 | Dwilinski et al. |
| 2006/0037529 | A1 | 2/2006 | D'Evelyn et al. |
| 2006/0037530 | A1 | 2/2006 | Dwilinski et al. |
| 2006/0048699 | A1 | 3/2006 | D'Evelyn et al. |
| 2006/0096521 | A1 | 5/2006 | D'Evelyn et al. |
| 2006/0118799 | A1 | 6/2006 | D'Evelyn et al. |
| 2006/0163589 | A1 | 7/2006 | Fan et al. |
| 2006/0169993 | A1 | 8/2006 | Fan et al. |
| 2006/0177362 | A1 | 8/2006 | D'Evelyn et al. |
| 2006/0207497 | A1 | 9/2006 | D'Evelyn et al. |
| 2006/0213429 | A1 | 9/2006 | Motoki et al. |
| 2006/0214287 | A1 | 9/2006 | Ogihara et al. |
| 2006/0255343 | A1 | 11/2006 | Ogihara et al. |
| 2007/0057337 | A1 | 3/2007 | Kano et al. |
| 2007/0096239 | A1 | 5/2007 | Cao et al. |
| 2007/0105351 | A1 | 5/2007 | Motoki et al. |
| 2007/0114569 | A1 | 5/2007 | Wu et al. |
| 2007/0121690 | A1 | 5/2007 | Fujii et al. |
| 2007/0131967 | A1 | 6/2007 | Kawaguchi et al. |
| 2007/0141819 | A1 | 6/2007 | Park et al. |
| 2007/0142204 | A1 | 6/2007 | Park et al. |
| 2007/0158785 | A1 | 7/2007 | D'Evelyn et al. |
| 2007/0178039 | A1 | 8/2007 | D'Evelyn et al. |
| 2007/0181056 | A1 | 8/2007 | D'Evelyn et al. |
| 2007/0210074 | A1 | 9/2007 | Maurer et al. |
| 2007/0215033 | A1 | 9/2007 | Imaeda et al. |
| 2007/0228404 | A1 | 10/2007 | Tran et al. |
| 2007/0274359 | A1 | 11/2007 | Takeuchi et al. |
| 2007/0290224 | A1 | 12/2007 | Ogawa |
| 2008/0006831 | A1 | 1/2008 | Ng |
| 2008/0023691 | A1 | 1/2008 | Jang et al. |
| 2008/0025360 | A1 | 1/2008 | Eichler et al. |
| 2008/0073660 | A1 | 3/2008 | Ohno et al. |
| 2008/0083741 | A1 | 4/2008 | Giddings et al. |
| 2008/0083929 | A1 | 4/2008 | Fan et al. |
| 2008/0087919 | A1 | 4/2008 | Tysoe et al. |
| 2008/0106212 | A1 | 5/2008 | Yen et al. |
| 2008/0121906 | A1 | 5/2008 | Yakushiji |
| 2008/0128752 | A1 | 6/2008 | Wu |
| 2008/0156254 | A1 | 7/2008 | Dwilinski et al. |
| 2008/0198881 | A1 | 8/2008 | Farrell et al. |
| 2008/0211416 | A1 | 9/2008 | Negley et al. |
| 2008/0230765 | A1 | 9/2008 | Yoon et al. |
| 2008/0282978 | A1 | 11/2008 | Butcher et al. |
| 2008/0285609 | A1 | 11/2008 | Ohta et al. |
| 2008/0298409 | A1 | 12/2008 | Yamashita et al. |
| 2009/0078955 | A1 | 3/2009 | Fan et al. |
| 2009/0092536 | A1 | 4/2009 | Kawabata et al. |
| 2009/0146170 | A1 | 6/2009 | Zhong et al. |
| 2009/0218593 | A1 | 9/2009 | Kamikawa et al. |
| 2009/0250686 | A1 | 10/2009 | Sato et al. |
| 2009/0301387 | A1 | 12/2009 | D'Evelyn |
| 2009/0301388 | A1 | 12/2009 | D'Evelyn |
| 2009/0309110 | A1 | 12/2009 | Raring et al. |
| 2009/0320744 | A1 | 12/2009 | D'Evelyn |
| 2009/0320745 | A1 | 12/2009 | D'Evelyn et al. |
| 2010/0001300 | A1 | 1/2010 | Raring et al. |
| 2010/0003492 | A1 | 1/2010 | D'Evelyn |
| 2010/0025656 | A1 | 2/2010 | Raring et al. |
| 2010/0031872 | A1 | 2/2010 | D'Evelyn |
| 2010/0031873 | A1 | 2/2010 | D'Evelyn |
| 2010/0031874 | A1 | 2/2010 | D'Evelyn |
| 2010/0031875 | A1 | 2/2010 | D'Evelyn |
| 2010/0031876 | A1 | 2/2010 | D'Evelyn |
| 2010/0032691 | A1 | 2/2010 | Kim |
| 2010/0108985 | A1 | 5/2010 | Chung et al. |
| 2010/0109030 | A1 | 5/2010 | Krames et al. |
| 2010/0117101 | A1 | 5/2010 | Kim et al. |
| 2010/0117118 | A1 | 5/2010 | Dabiran et al. |
| 2010/0147210 | A1 | 6/2010 | D'Evelyn |
| 2010/0151194 | A1 | 6/2010 | D'Evelyn |
| 2010/0295088 | A1 | 11/2010 | D'Evelyn et al. |
| 2011/0017298 | A1 | 1/2011 | Lee |
| 2011/0100291 | A1 | 5/2011 | D'Evelyn |
| 2011/0108081 | A1 | 5/2011 | Werthen et al. |
| 2011/0121331 | A1 | 5/2011 | Simonian et al. |
| 2011/0175200 | A1 | 7/2011 | Yoshida |
| 2011/0183498 | A1 | 7/2011 | D'Evelyn |
| 2011/0220912 | A1 | 9/2011 | D'Evelyn |
| 2011/0256693 | A1 | 10/2011 | D'Evelyn et al. |
| 2011/0262773 | A1 | 10/2011 | Poblenz et al. |
| 2012/0000415 | A1 | 1/2012 | D'Evelyn et al. |
| 2012/0007102 | A1 | 1/2012 | Feezell et al. |
| 2012/0073494 | A1 | 3/2012 | D'Evelyn |
| 2012/0091465 | A1 | 4/2012 | Krames et al. |
| 2012/0118223 | A1 | 5/2012 | D'Evelyn |
| 2012/0119218 | A1* | 5/2012 | Su .................................. 257/76 |
| 2012/0137966 | A1 | 6/2012 | D'Evelyn et al. |
| 2012/0178215 | A1 | 7/2012 | D'Evelyn |
| 2012/0187412 | A1 | 7/2012 | D'Evelyn et al. |
| 2012/0199952 | A1 | 8/2012 | D'Evelyn et al. |

OTHER PUBLICATIONS

Fukuda et al., 'Prospects for the Ammonothermal Growth of Large GaN Crystal,' Journal of Crystal Growth, vol. 305, 2007, pp. 304-310.

Iso et al., 'High Brightness Blue InGaN/GaN Light Emitting Diode on Nonpolar m-Plane Bulk GaN Substrate,' Japanese Journal of Applied Physics, vol. 46, No. 40, pp. L960-L962, 2007.

Lide et al., 'Thermal Conductivity of Ceramics and Other Insulating Materials,' CRC Handbook of Chemistry and Physics, 91st Edition, 2010-2011, pp. 12-203 and 12-204.

Pattison et al., 'Gallium Nitride Based Microcavity Light Emitting Diodes With 2λ Effective Cavity Thickness', Applied Physics Letters, vol. 90, Issue 3, 031111 (2007) 3pg.

Sarva et al., 'Dynamic Compressive Strength of Silicon Carbide Under Uniaxial Compression,' Material Sciences and Engineering, vol. A317, 2001, pp. 140-144.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/133,364 dated Nov. 26, 2010.

USPTO Office Action for U.S. Appl. No. 12/133,364 dated Jun. 1, 2011.

USPTO Notice of Allowance for U.S. Appl. No. 12/133,364 dated Oct. 11, 2011.

USPTO Office Action for U.S. Appl. No. 12/133,365 dated Jun. 9, 2011.

USPTO Office Action for U.S. Appl. No. 12/133,365 dated Oct. 18, 2011.

USPTO Office Action for U.S. Appl. No. 12/334,418 dated Apr. 5, 2011.

USPTO Office Action for U.S. Appl. No. 12/334,418 dated Oct. 19, 2011.

USPTO Office Action for U.S. Appl. No. 12/478,736 dated Sep. 27, 2011.

USPTO Office Action for U.S. Appl. No. 12/478,736 dated Feb. 7, 2012.

USPTO Notice of Allowance for U.S. Appl. No. 12/478,736 dated Apr. 23, 2012.

USPTO Office Action for U.S. Appl. No. 12/484,095 dated Nov. 10, 2010.

USPTO Office Action for U.S. Appl. No. 12/484,095 dated Jul. 8, 2011.

USPTO Office Action for U.S. Appl. No. 12/497,969 dated Feb. 2, 2012.

USPTO Office Action for U.S. Appl. No. 12/497,969 dated Jul. 5, 2012.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/534,843 dated Sep. 10, 2012.

USPTO Office Action for U.S. Appl. No. 12/534,844 dated Sep. 16, 2010.

USPTO Office Action for U.S. Appl. No. 12/534,844 dated Feb. 2, 2011.

USPTO Notice of Allowance for U.S. Appl. No. 12/534,849 dated Jul. 31, 2012.

USPTO Office Action for U.S. Appl. No. 12/534,857 dated Sep. 1, 2010.

USPTO Notice of Allowance for U.S. Appl. No. 12/534,857 dated May 27, 2011.

USPTO Office Action for U.S. Appl. No. 12/546,458 dated Jul. 20, 2011.

USPTO Notice of Allowance for U.S. Appl. No. 12/546,458 dated Nov. 28, 2011.

USPTO Office Action for U.S. Appl. No. 12/556,558 dated Sep. 16, 2010.

USPTO Notice of Allowance for U.S. Appl. No. 12/556,558 dated Mar. 22, 2011.

USPTO Office Action for U.S. Appl. No. 12/556,562 dated Sep. 15, 2010.

USPTO Office Action for U.S. Appl. No. 12/556,562 dated Mar. 21, 2011.

USPTO Notice of Allowance for U.S. Appl. No. 12/556,562 dated Jul. 27, 2011.

USPTO Office Action for U.S. Appl. No. 12/569,337 dated May 9, 2012.

USPTO Office Action for U.S. Appl. No. 12/569,841 dated Dec. 23, 2011.

USPTO Office Action for U.S. Appl. No. 12/634,665 dated Apr. 25, 2012.

USPTO Office Action for U.S. Appl. No. 12/724,983 dated Mar. 5, 2012.

USPTO Notice of Allowance for U.S. Appl. No. 12/754,886 dated May 17, 2012.

USPTO Notice of Allowance for U.S. Appl. No. 12/754,886 dated Jun. 5, 2012.

USPTO Notice of Allowance for U.S. Appl. No. 12/754,886 dated Jun. 20, 2012.

USPTO Office Action for U.S. Appl. No. 12/785,404 dated Mar. 6, 2012.

USPTO Notice of Allowance for U.S. Appl. No. 12/785,404 dated Jul. 16, 2012.

USPTO Office Action for U.S. Appl. No. 13/179,346 dated Aug. 17, 2012.

USPTO Notice of Allowance for U.S. Appl. No. 13/425,304 dated Aug. 22, 2012.

Choi et al., '2.51 microcavity InGaN light-emitting diodes fabricated by a selective dry-etch thinning process', Applied Physics Letters, 2007, 91(6), 061120.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).

USPTO Notice of Allowance for U.S. Appl. No. 12/478,736 dated Oct. 9, 2012.

USPTO Notice of Allowance for U.S. Appl. No. 12/569,337 dated Nov. 15, 2012.

USPTO Office Action for U.S. Appl. No. 12/569,844 dated Oct. 12, 2012.

USPTO Office Action for U.S. Appl. No. 12/634,665 dated Oct. 1, 2012.

USPTO Office Action for U.S. Appl. No. 12/891,668 dated Sep. 25, 2012.

USPTO Office Action for U.S. Appl. No. 13/025,833 dated Jul. 12, 2012.

USPTO Office Action for U.S. Appl. No. 13/041,199 dated Nov. 30, 2012.

USPTO Office Action for U.S. Appl. No. 13/175,739 dated Dec. 7, 2012.

USPTO Office Action for U.S. Appl. No. 13/179,346 dated Dec. 13, 2012.

USPTO Office Action for U.S. Appl. No. 13/226,249 dated Oct. 10, 2012.

USPTO Notice of Allowance for U.S. Appl. No. 12/534,843 dated Jan. 24, 2013.

Communication from the Polish Patent Office re P394857 dated Jan. 22, 2013, 2 pages.

USPTO Notice of Allowance for U.S. Appl. No. 12/634,665 dated Feb. 15, 2013.

USPTO Office Action for U.S. Appl. No. 13/041,199 dated Mar. 12, 2013.

USPTO Notice of Allowance for U.S. Appl. No. 13/226,249 dated Feb. 21, 2013.

* cited by examiner

LARGE AREA NONPOLAR OR SEMIPOLAR GALLIUM AND NITROGEN CONTAINING SUBSTRATE AND RESULTING DEVICES

RELATED APPLICATIONS

This application claim priority to U.S. provisional application, 61/507,829, filed on Jul. 14, 2011, entitled "LARGE AREA NONPOLAR OR SEMIPOLAR GALLIUM AND NITROGEN CONTAINING SUBSTRATE AND RESULTING DEVICES", which is hereby incorporated by reference in its entirety.

BACKGROUND

This disclosure relates generally to lighting, and embodiments of the disclosure include techniques for fabricating a large area non-polar or semi-polar gallium and nitrogen containing substrates using nucleation, growth, and coalescing processes. The disclosure can provide substrates for LEDs for white lighting, multi-colored lighting, flat panel displays and other optoelectronic devices.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to AC power or DC power. The conventional light bulb can be found commonly houses, buildings, and outdoor lightings, and other areas requiring light. Unfortunately, the conventional light bulb dissipates about 90% of the energy used as thermal energy. Additionally, the conventional light bulb routinely fails often due to thermal expansion and contraction of the filament.

Solid state lighting techniques are known. Solid state lighting relies upon semiconductor materials to produce light emitting diodes (LEDs). Red LEDs use Aluminum Indium Gallium Phosphide or AlInGaP semiconductor material. Most recently, Shuji Nakamura pioneered the use of InGaN materials to produce optoelectronic devices emitting light in the violet, blue, and green color range for LEDs and laser diodes. The blue and violet colored LEDs and laser diodes have led to innovations such as solid state white lighting.

GaN-based devices fabricated on bulk GaN substrates with nonpolar or semipolar crystallographic orientations have been shown to have certain favorable characteristics, such as improved efficiency at high current densities and/or elevated temperatures. Most such substrates, however, have been limited in size, with lateral dimensions of about 5 mm wide by 15 mm long. This size limitation, together with relatively high cost, has significantly limited the development and implementation of nonpolar and semipolar GaN-based devices. What is needed is a cost effective means for fabricating large area nonpolar and semipolar bulk GaN substrates, together with methods for fabricating high performance, low cost LEDs and laser diodes on these substrates.

BRIEF SUMMARY

In a specific embodiment, the method includes providing a gallium and arsenic containing substrate having a major surface region and forming a plurality of recessed regions within a thickness of the substrate. Preferably, each of the recessed regions has a first exposed surface of a first crystallographic orientation and a second exposed surface of a second crystallographic orientation. Masking material is formed over at least the first exposed surface of each of the recessed regions, and a nucleation material is formed over the second exposed surface of each of the recessed regions. Gallium and nitrogen containing material are then formed over the nucleation material to fill the recessed regions to form growth structures in each of the recessed regions. The growth structures are then coalesced to form a thickness of a gallium and nitrogen containing material. Then a step of releasing the resulting thickness of the gallium and nitrogen containing material is performed to separate it from at least the major surface region.

The present method provides for fabrication of cost-effective, large area nonpolar and semipolar bulk GaN substrates. The substrates may be used as seed crystals for subsequent bulk crystal growth. In addition, the method enables fabrication of cost-effective, high-performance LEDs and laser diodes. The present method and resulting device can be fabricated using known process equipment, which is easy and cost effective to scale.

DETAILED DESCRIPTION

Referring to FIGS. 1 through 4, a method of fabricating a large area nonpolar substrate according to an embodiment of the present disclosure is outlined below.

Figure 1:
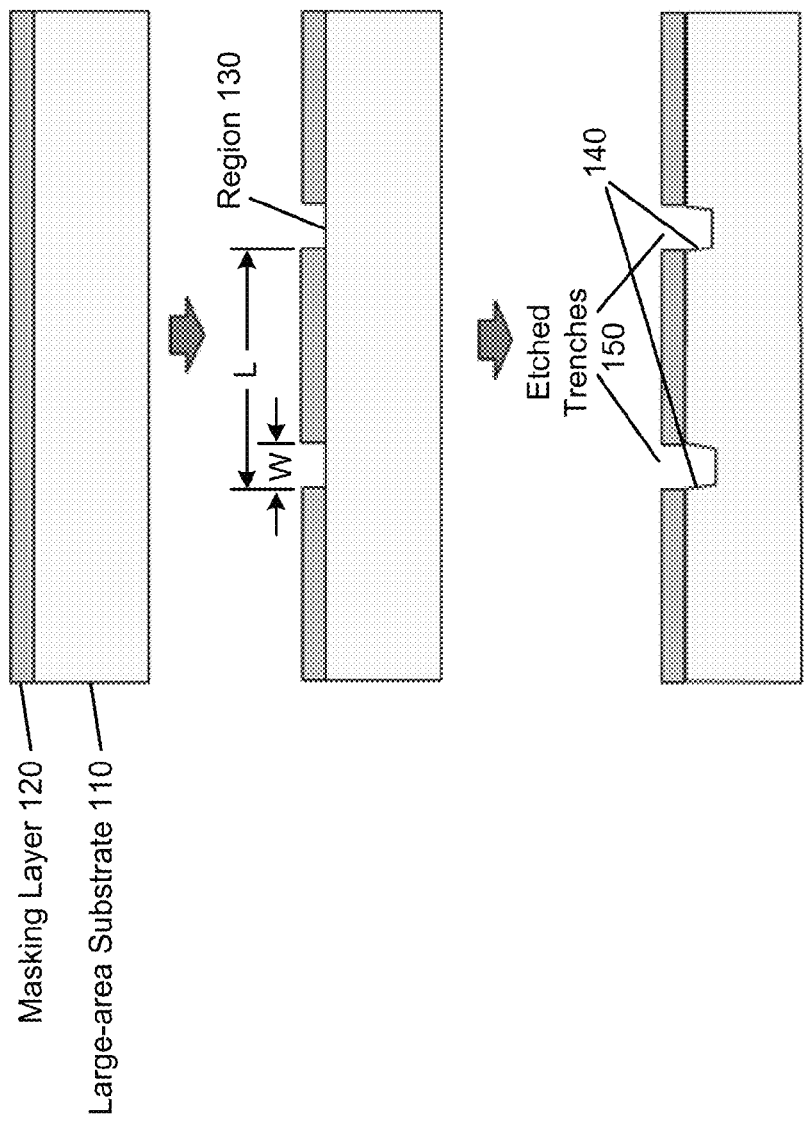
FIGS. 1 through 4 are diagrams illustrating a method of fabricating a large area substrate.
Figure 2:
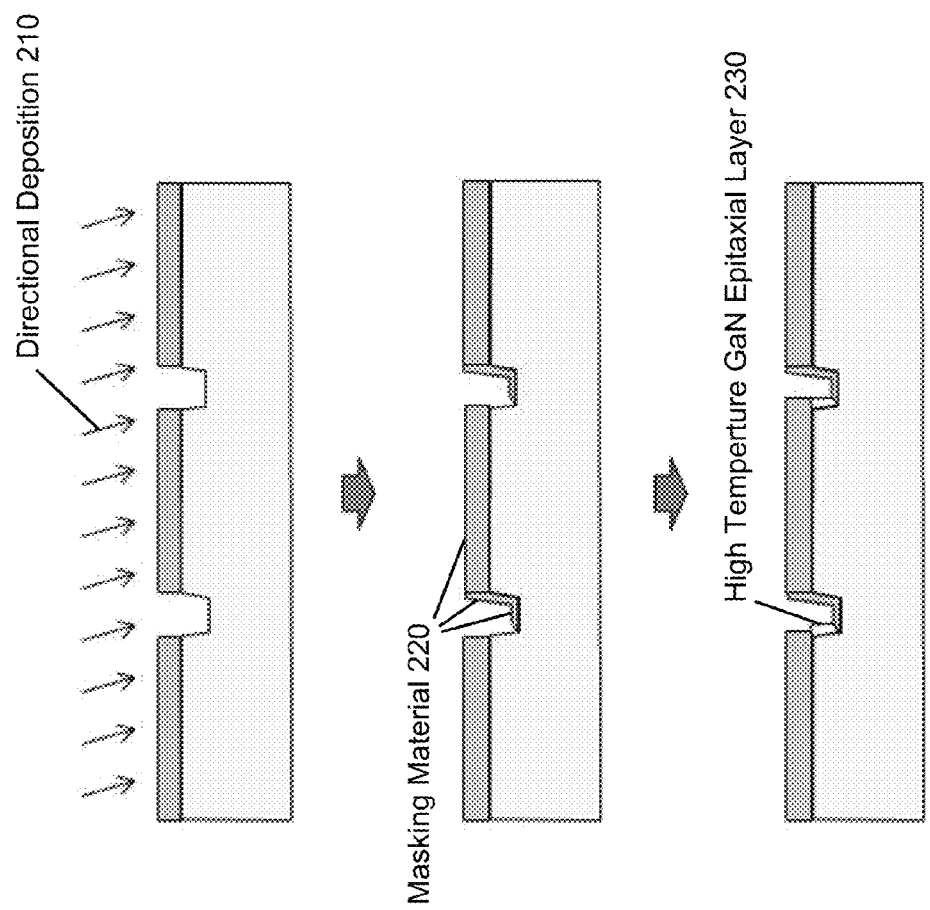

1. Referring first to FIG. 1, supply a large-area substrate 110, for example of GaAs. The substrate orientation may be chosen so that the [111]A direction lies in the plane of the surface. For example, the large-area surface may have a (110) orientation.
2. Deposit a masking layer 120, e.g., a photoresist, $SiO_x$, or $SiN_x$, $SrF_2$, or Ni onto the surface, with a thickness of approximately 50 nm-1 micron. Pattern the surface into strips by conventional photolithography with an array (e.g., a one-dimensional or linear array, a two-dimensional array, etc.) of masks or mask strips, with the edges of the masks lying along the intersection of (111)A surfaces with the large-area surface. The openings between the masks 130 may have a width w between about 1 micron and about 10 microns and the pattern has a period L between about 2 microns and about 5000 microns, preferably between about 5 microns and about 1000 microns.
3. Form etched trenches 150, with a depth d between about 1 micron to about 10 microns, with sidewalls that are vertical to within 30 degrees, for example, by reactive-ion etching with $Cl_2/BCl_3/SiCl_4$ and/or with $CF_4/CHF_3/SF_6/O_2/Ar/N_2$. Optionally, wet-etch to remove damage and prepare a plurality of smooth surfaces 140 with an orientation within degrees of (111)A.
4. Referring next to FIG. 2, deposit a layer of masking material 220, e.g., comprising $SiO_x$ or $SiN_x$, onto the surface, with a thickness of 50 nm-1 micron, by directional deposition 210, e.g., sputtering, ion beam deposition, onto the non-(111)A surfaces.
5. Deposit a low-temperature nucleation layer and a high-temperature GaN epitaxial layer 230 on the (111)A surfaces by metalorganic chemical vapor deposition (MOCVD) or molecular beam epitaxy (MBE).

Figure 3:
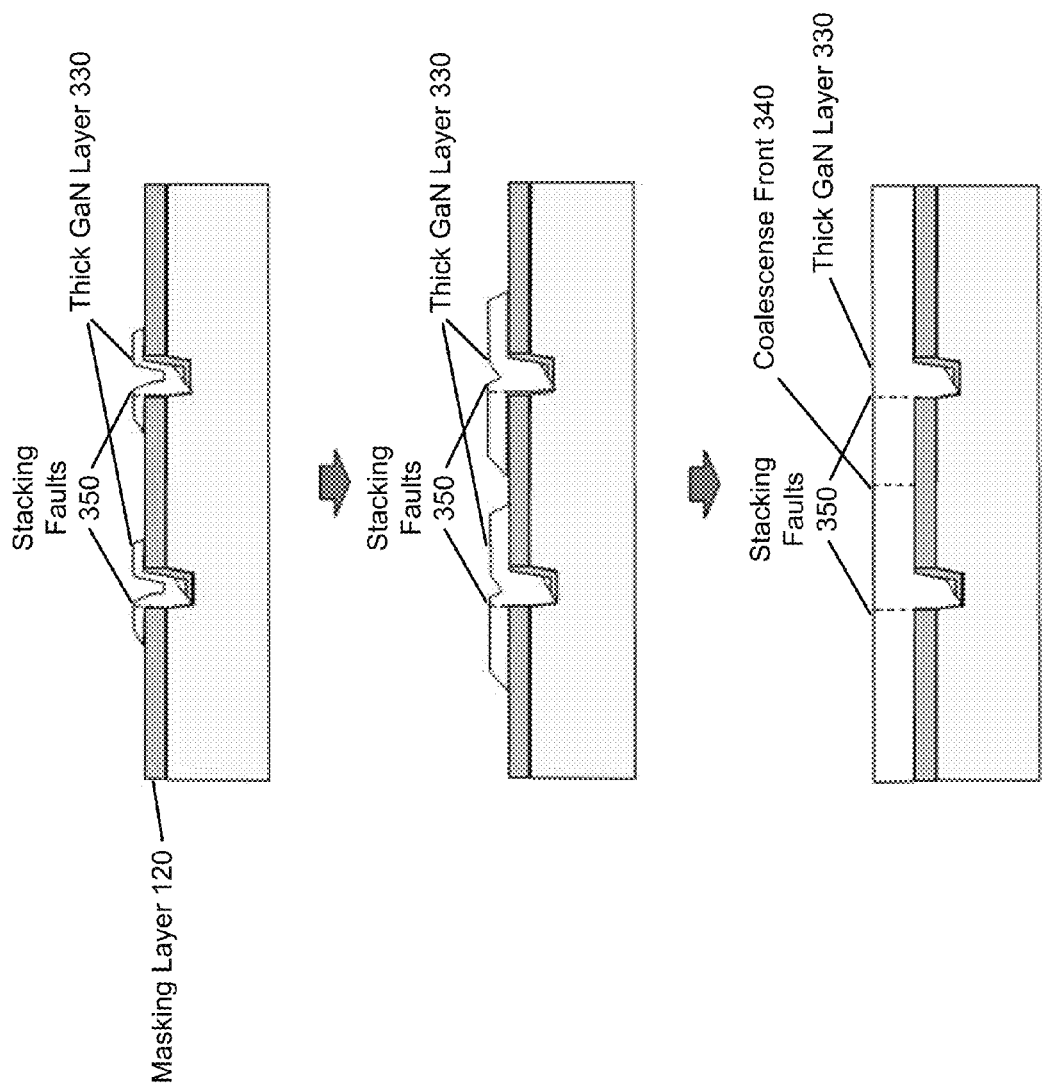

6. Referring now to FIG. 3, grow a thick GaN layer 330 by hydride vapor phase epitaxy (HVPE). Overall layer thickness is between about 1 micron to about 10 millimeters. A coalescence front 340 may form between separate domains, but the edge dislocation density at coalescence fronts should be less than about $10^4$ cm$^{-1}$. Some stacking faults 350 may be generated at the (000-1) face of the growing GaN film where it emerges from openings in the original masking layer 120. The concentration of stacking faults should be less than about $10^4$ cm$^{-1}$.

Figure 4:
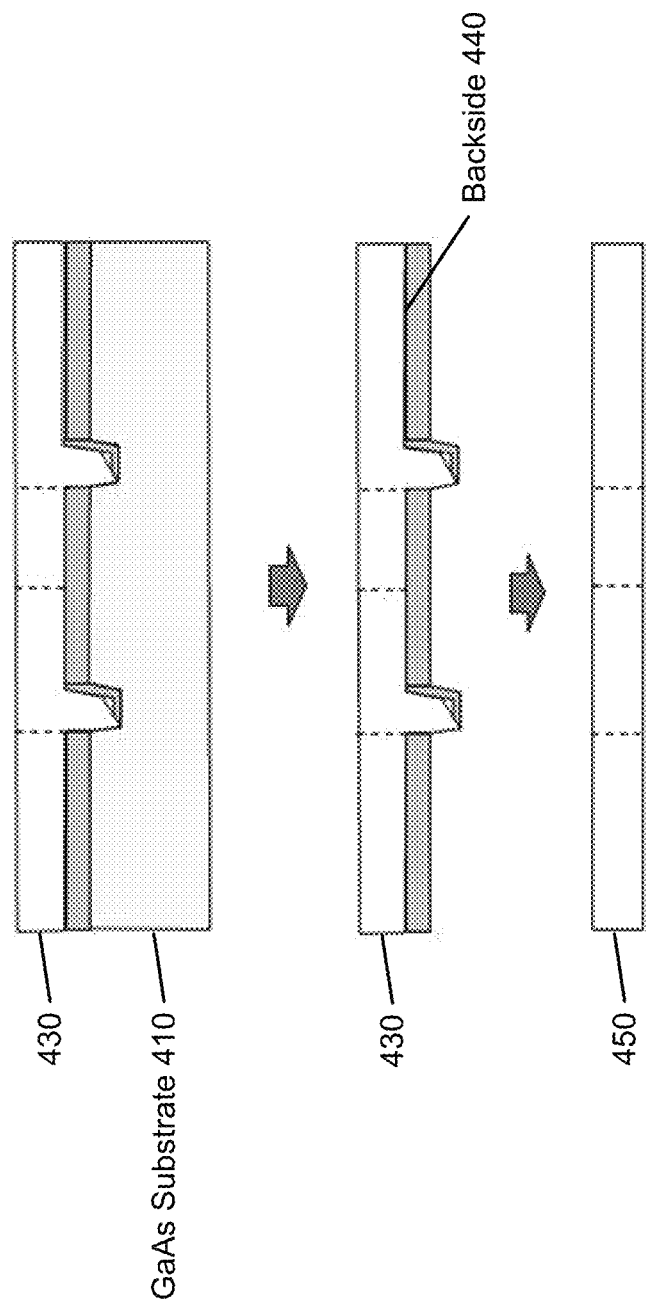

7. Referring now to FIG. 4, remove the GaAs substrate 410, e.g., by dissolution in mineral acid.

8. Lap backside 440 of free-standing GaN substrate 430.

9. Optionally, lap, polish, chemical-mechanical polish front and back surfaces to prepare a free-standing GaN substrate or wafer 450.

10. Perform a device manufacturing process on the free standing substrate or wafer to form devices; and 11. Perform other steps, as desired.

The above sequence of steps provides large area crystalline material.

As shown, FIGS. 1 through 4 illustrate a method for fabricating a large area nonpolar substrate. The method begins by providing a large-area substrate 110, for example of GaAs or other suitable substrate. The substrate has a predetermined area typically larger than 15 square centimeters. In certain embodiments, the substrate orientation is chosen so that [111]A direction lies in the plane of the surface. The large-area surface also may have a (110) orientation.

Referring again to the FIGS. 1 through 4, a masking layer 120, e.g., photoresist, SiO$_x$, or SiN$_x$, SrF$_2$, or Ni is deposited onto the surface with a thickness of 50 nm-1 micron. The masking layer is exposed and developed to expose regions 130 of the substrate with the edges of the mask lying along the intersection of (111)A surfaces with the large-area surface. The openings between the masks have a width w between about 1 micron and about 10 microns and the pattern preferably has a period L between about 2 microns and about 5000 microns. In another specific embodiment, the openings between the masks comprise a two-dimensional array of localized openings, for example, with a square, rectangular, hexagonal, or circular shape. The two-dimensional array itself may be square, rectangular, or hexagonal. In the case of square or hexagonal arrays, the period L may be between about 2 microns and about 5000 microns. In the case of rectangular arrays, each of the periods $L_1$ and $L_2$ in orthogonal directions may be between about 2 microns and about 5000 microns.

Etched trenches 150 are then formed, e.g. with a depth d between about 1 micron and about 10 microns and with sidewalls that are vertical to within 30 degrees, for example, by reactive-ion etching with Cl$_2$/BCl$_3$/SiCl$_4$ and/or with CF$_4$/CHF$_3$/SF$_6$/O$_2$/Ar/N$_2$ or other suitable chemistry. Afterward a wet-etch can be used to remove damage resulting in a plurality of smooth (111)A surfaces 140 on sidewalls of the etched trenches 150.

Referring now to FIG. 2, a masking material, e.g., SiO$_x$ or SiN$_x$, is deposited onto the surface, with a thickness of 50 nm-1 micron by directional deposition, e.g., sputtering, ion beam deposition, onto the non-(111)A surfaces. Reference numeral 210 indicates the directional deposition of the masking material 220 to the non-(111)A surfaces. The method then deposits a low-temperature nucleation layer and a high-temperature GaN epitaxial layer 230 on the (111)A surfaces by metalorganic chemical vapor deposition (MOCVD) or molecular beam epitaxy (MBE). In a specific embodiment, the low temperature nucleation layer or material several hundred Angstroms thick is deposited by MOCVD at a temperature between about 450 degrees Celsius and about 600 degrees Celsius using trimethylgallium and ammonia as the Ga and N precursors, respectively. The high temperature MOCVD material is provided at a temperature between about 1000 degrees Celsius and about 1100 degrees Celsius, again using trimethylgallium and ammonia as the Ga and N precursors, respectively.

Referring now to FIG. 3, a thick GaN layer 330 or material is formed by hydride vapor phase epitaxy (HVPE). Overall layer thickness is between about 1 micron and about 10 millimeters, but there can be other thicknesses depending upon the specific embodiment. A coalescence front 340 may form between separate domains, and the edge dislocation density at coalescence fronts may be greater than about $10^2$ cm$^{-1}$ or greater than about $10^3$ cm$^{-1}$ and may be less than about $10^4$ cm$^{-1}$. In a specific embodiment, some stacking faults 350 may be generated at the (000-1) face of the growing GaN film where it emerges from the openings in the original masking layer 120. The region of the growing GaN formed above the openings in the original masking layer 120 is referred to herein as a seed region. The concentration of stacking faults may be greater than about 1 cm$^{-1}$, greater than about 10 cm$^{-1}$, or greater than about 100 cm$^{-1}$, and may be less than about $10^4$ cm$^{-1}$. As shown, the growth forms thick gallium and nitrogen containing material (e.g., a thick GaN layer) 330.

Referring now to FIG. 4, the thick gallium and nitrogen material 430 is separated from the GaAs substrate 410. The GaAs substrate 410 may be separated by dissolution in mineral acids. In a specific embodiment, other techniques such as laser lift-off, selective etching in a flux, spontaneous stress-induced lift-off, lapping, or the like may be used. If desired, lapping of the backside of free-standing GaN substrate can flatten the backside 440. Also optionally, a lap, polish, chemical-mechanical polish front and/or back surfaces can be performed. Once the free standing film 450 has been released and prepared, a device manufacturing process can be performed on the substrate to form LEDs or other devices as desired. The free-standing GaN substrate has a wurtzite structure, a nonpolar major surface orientation, and comprises a one- or two-dimensional array of seed regions and coalescence fronts.

Referring to now to FIGS. 5 through 11, a method of fabricating a large area semi-polar substrate according to an alternative embodiment of the present disclosure is outlined below.

Figure 5:
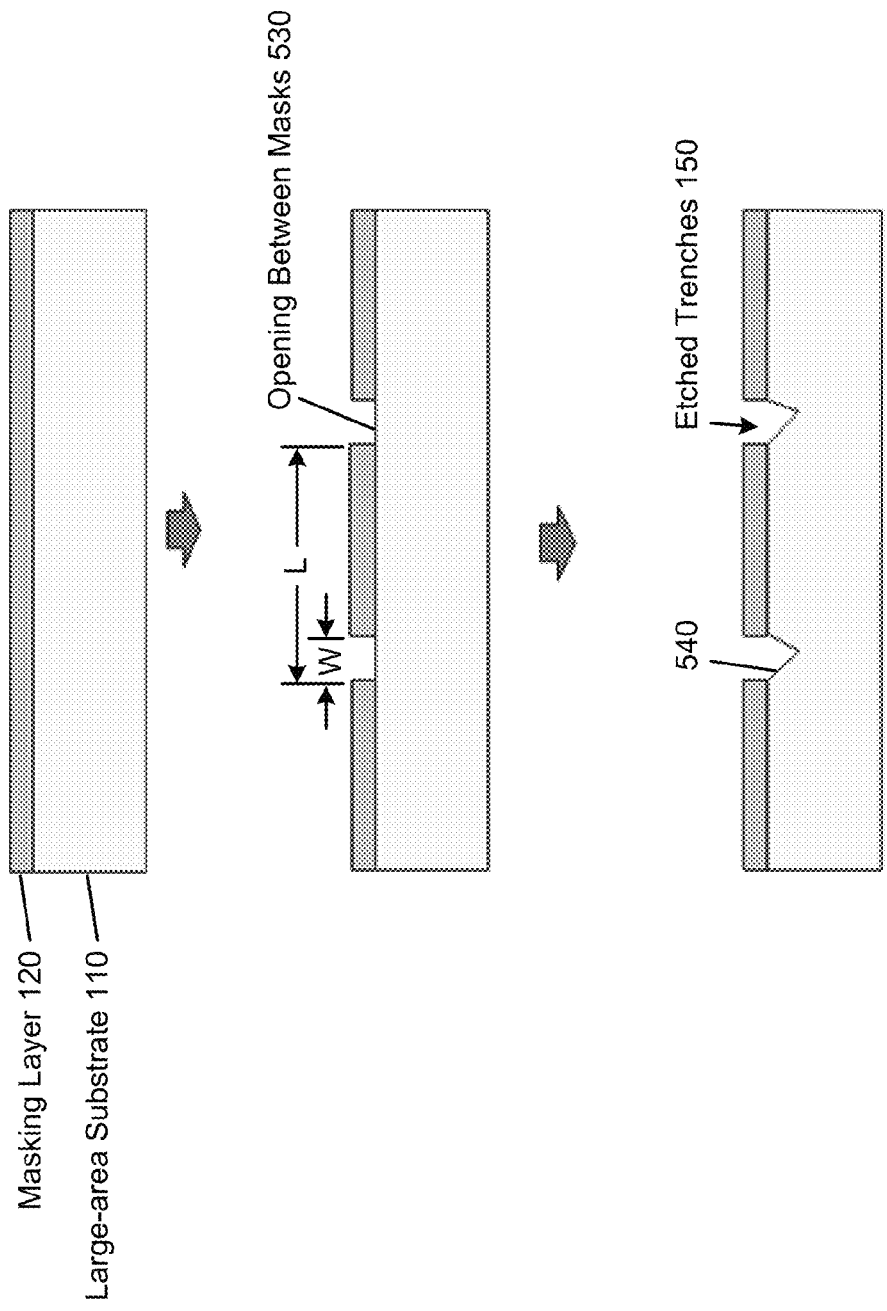
FIGS. 5 through 10 are diagrams illustrating an alternative method of fabricating a large area substrate.

1. Referring first to FIG. 5, supply a large-area substrate 110, for example, of GaAs. Select the substrate orientation so that a {111}A surface makes the same angle with respect to the surface as the (0001) Ga surface of GaN makes with respect to the desired semi-polar surface. For example, in one specific embodiment, the (20-21) surface of GaN makes angles of 75.1° with respect to the +c plane and 14.9° with respect to the closest m-plane. The surface orientation of the GaAs surface may be chosen to be within 50 of (1 −1 0.7) or of (1.22 −0.78 0.22). In another specific embodiment, the (10-11) surface of GaN makes angles of 62.0° with respect to the +c plane and 28.0° with respect to the closest m-plane. The surface orientation of the GaAs surface may be chosen to be within 5° of (1 −1 2) or of (1.43 −0.56 0.43). In still another specific embodiment, the (11-22) surface of GaN makes an angle of 58.4° with respect to the c+ plane and is perpendicular to an m-plane. The surface orientation of the GaAs surface may be chosen to be within 5° of (1 –1 3) or of (3 –1 1).

2. Deposit a mask layer 120, e.g., $SiO_x$ or $SiN_x$, onto the surface, with a thickness of approximately 50 nm-1 micron. Pattern the surface into strips by conventional photolithography with the edges of the masks lying along the intersection of (111)A surfaces with the large-area surface. The openings between the masks 530 may have a width w between about 1 micron and about 10 microns and the pattern may have a period L between about 2 microns and about 5000 microns, or preferably between about 5 microns and about 1000 microns.

3. Prepare trenches 150 with (111)A facets 540, for example, by wet-etching with a selective etch.

Figure 6:
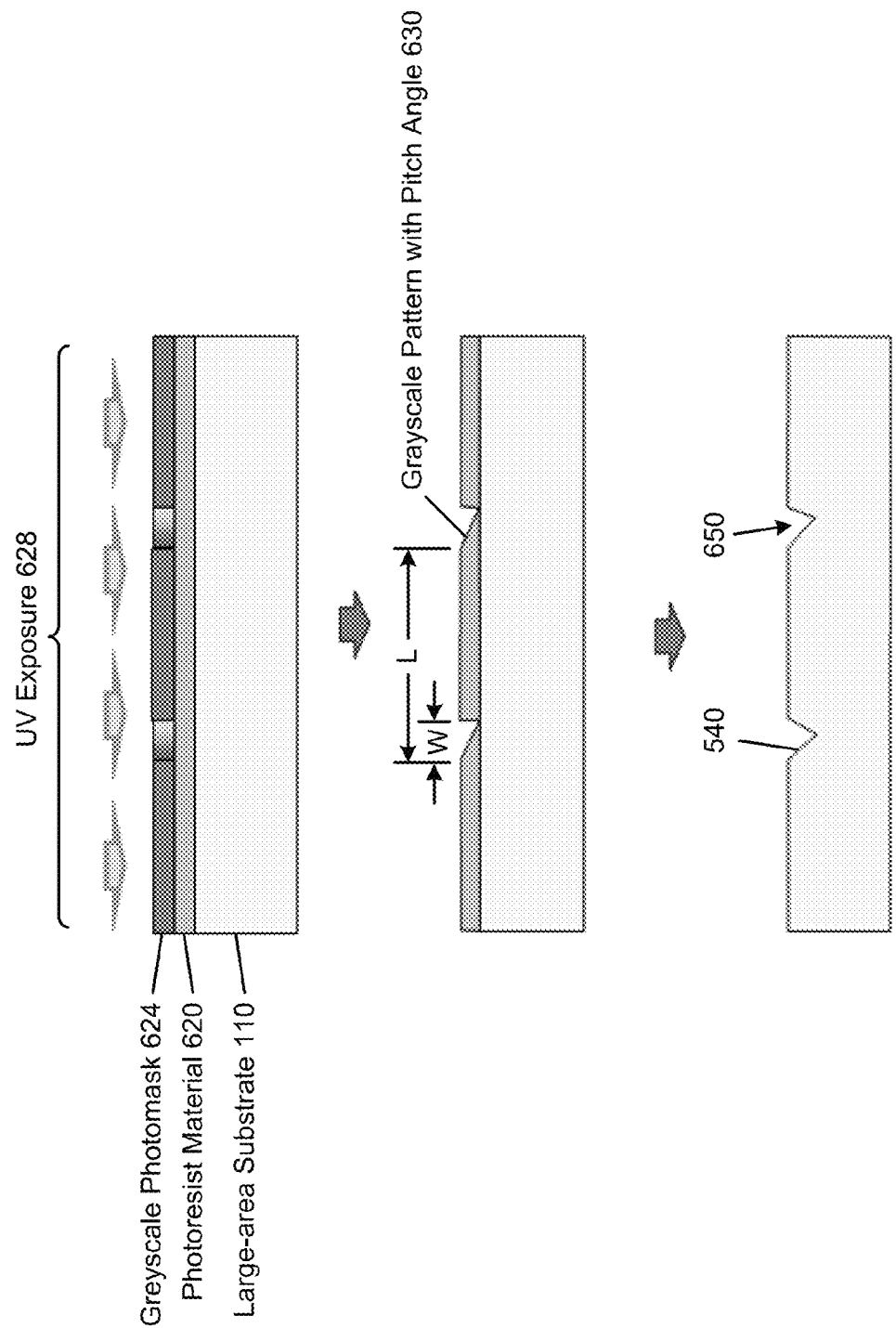

4. In a first alternative embodiment, as shown in FIG. 6, an array of trenches 650 in the substrate may be prepared by gray scale photolithography. Deposit a layer of photoresist material 620 onto the surface of substrate 110, with a thickness of approximately 50 nm-1 micron. Perform a UV exposure 628 through a grayscale photomask 624, e.g., HEBS-glass, with a pre-determined e-beam-developed pattern. Develop the photoresist to form a gray scale pattern with the desired pitch angle.

5. Dry etch, e.g., by RIE, to prepare trenches with a pitch angle chosen to provide (111)A facets 540.

Figure 7:
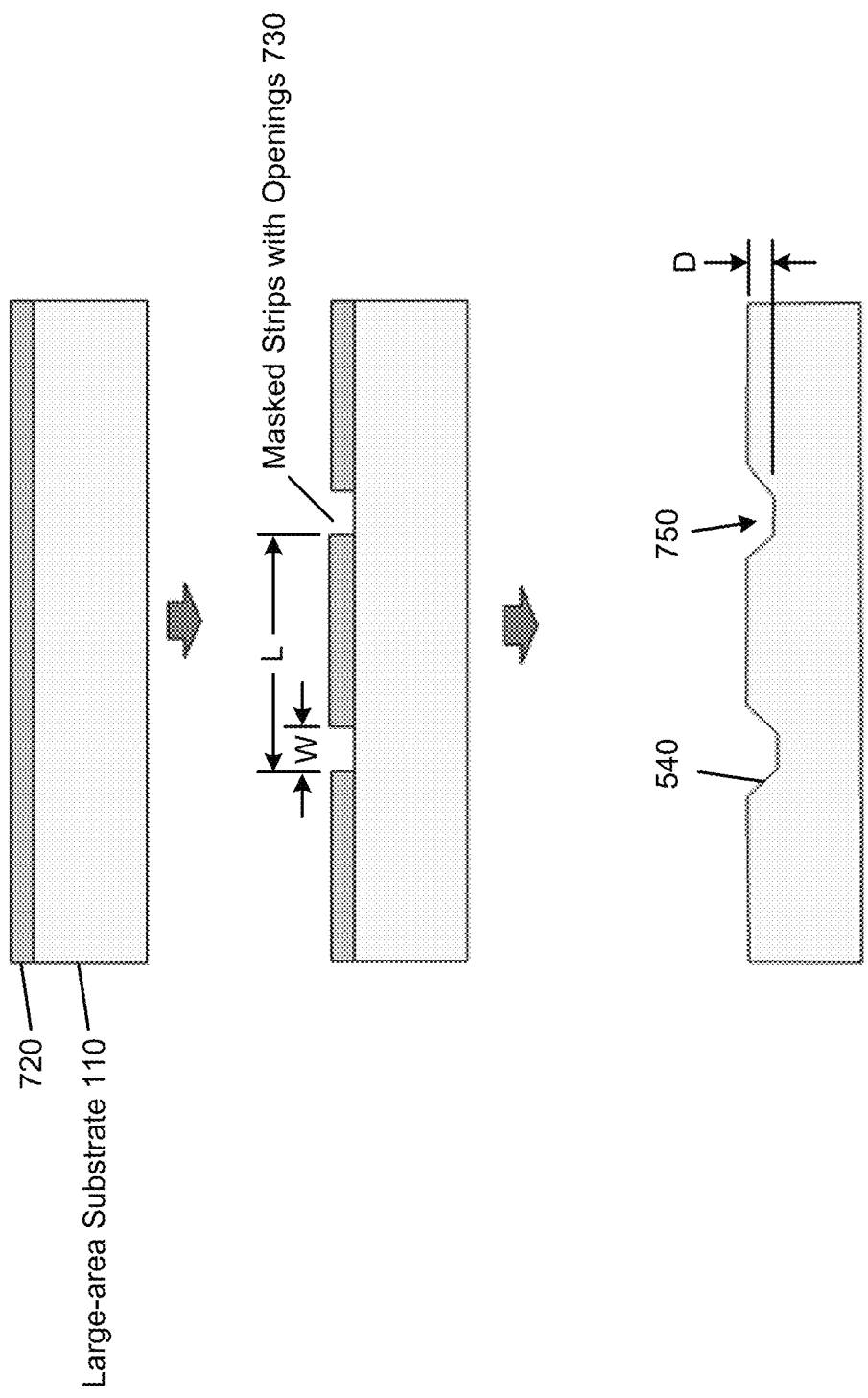

6. In a second alternative embodiment, as shown in FIG. 7, an array of trenches 750 is formed by inductively-coupled plasma etching. Deposit a mask 720, e.g., photoresist, $SiO_x$, or $SiN_x$, $SrF_2$, or Ni onto the surface of substrate 110, with a thickness of approximately 50 nm-1 micron. Pattern the surface into strips by conventional photolithography with an array of mask strips 730 having width w and period L.

7. Perform inductively-coupled plasma etching, using the chemistry, process conditions, and composition and thickness of the mask to vary the angle of the sidewalls so as to expose (111)A facets 540.

Figure 8:
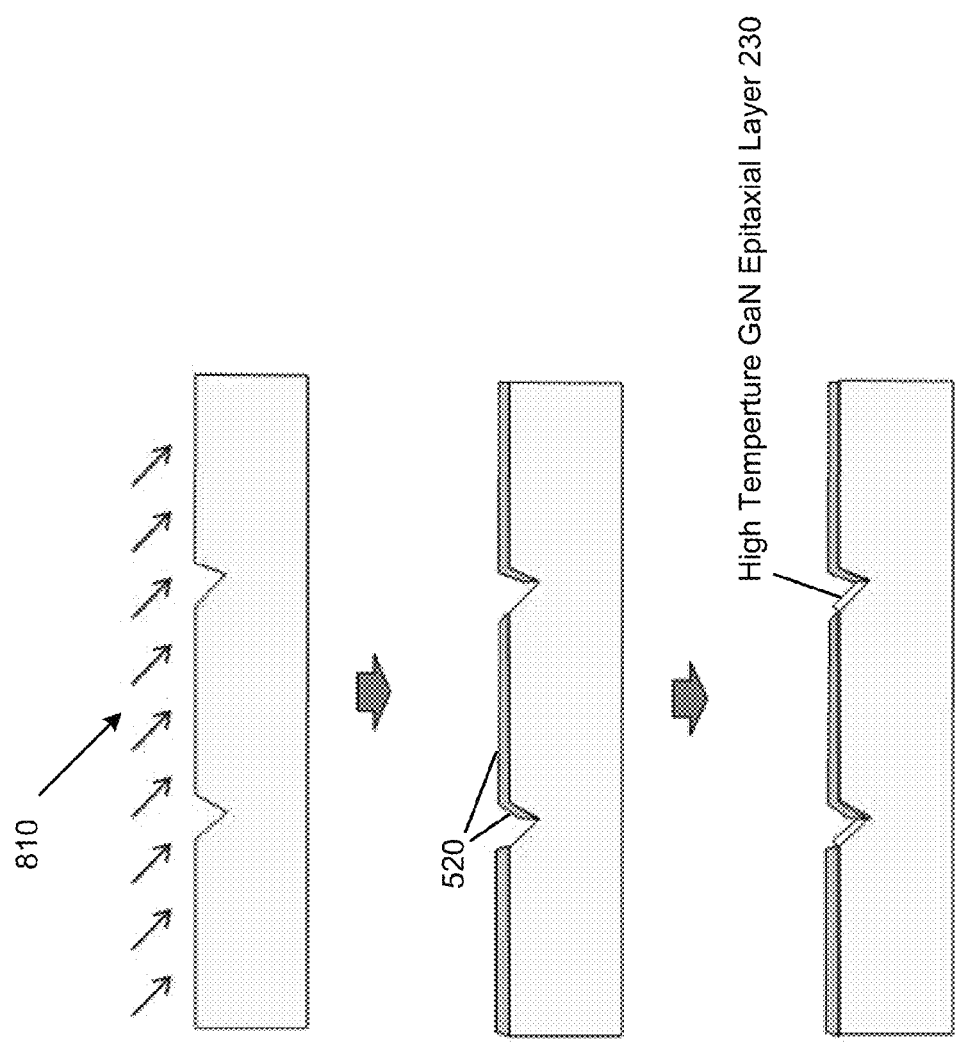

8. Referring now to FIG. 8, deposit a mask layer 520, e.g., $SiO_x$ or $SiN_x$, onto the surface, with a thickness of approximately 50 nm-1 micron, by directional deposition 810, e.g., sputtering, ion beam deposition, onto the non-(111)A surfaces.

9. Deposit a low-temperature nucleation layer and a high-temperature GaN epitaxial layer 230 on the (111)A surfaces by metalorganic chemical vapor deposition (MOCVD) or molecular beam epitaxy (MBE).

Figure 9:
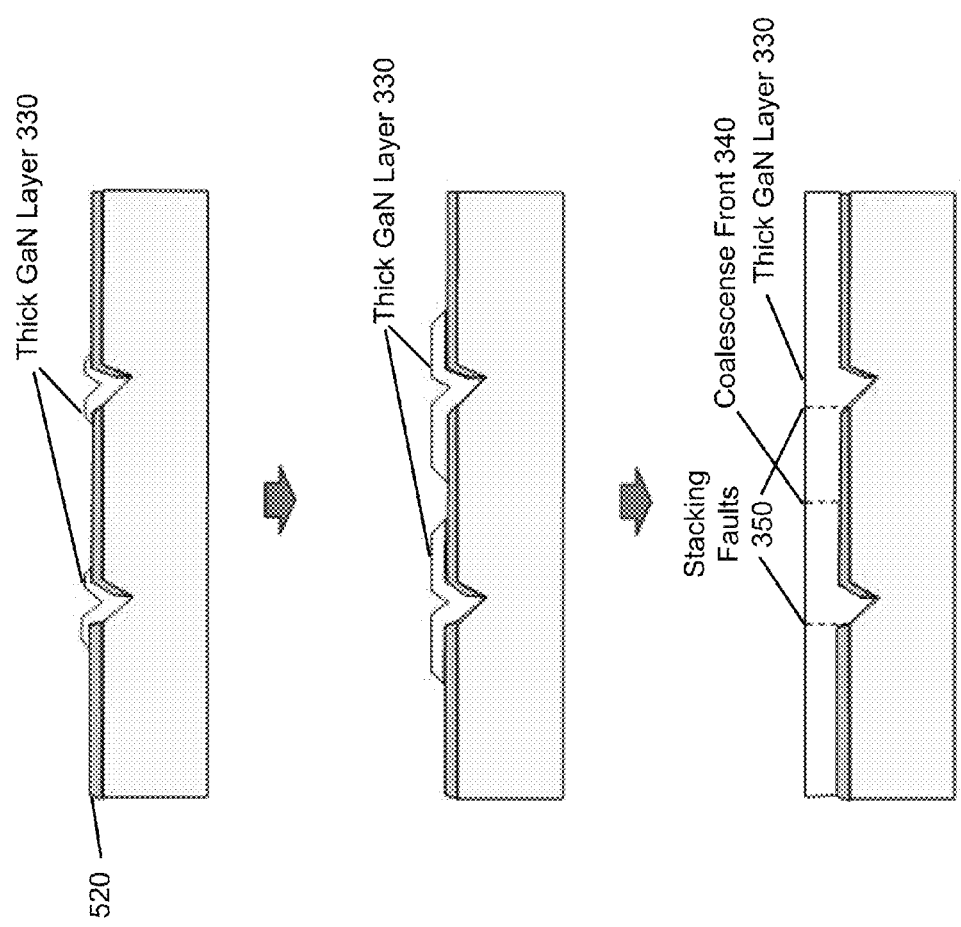

10. Referring now to FIG. 9, grow a thick GaN layer 330 by hydride vapor phase epitaxy (HVPE). The overall layer thickness is between about 1 micron to about 10 millimeters. A coalescence front 340 may form between separate domains but the edge dislocation density at coalescence fronts should be less than about $10^4$ $cm^{-1}$. Some stacking faults 350 may be generated at the (000-1) face of the growing GaN film where it emerges from the original mask layer 520. The concentration of stacking faults should be less than about $10^4$ $cm^{-1}$.

Figure 10:
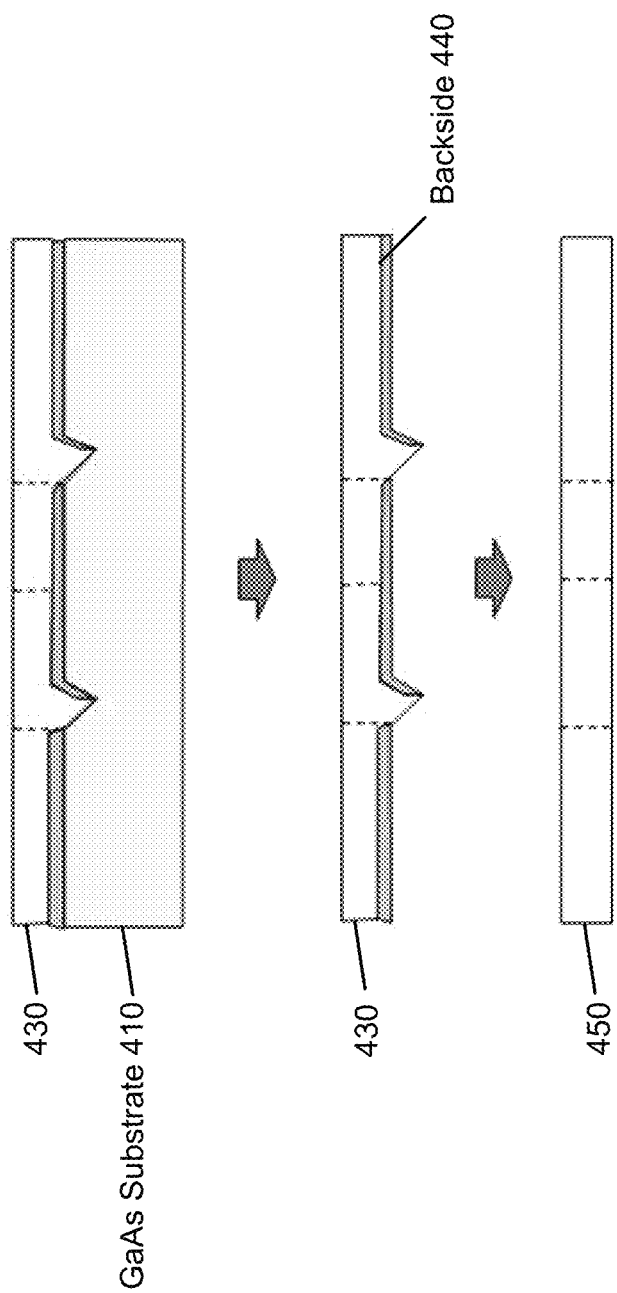

11. Referring now to FIG. 10, remove the GaAs substrate 410, e.g., by dissolution in mineral acids.

12. Lap the backside 440 of the free-standing GaN substrate 430.

13. Optionally, lap, polish, chemical-mechanical polish front and back surfaces to form a free-standing substrate or wafer 450.

12. Perform a device manufacturing process on the free standing substrate to form devices; and 13. Perform other steps, as desired.

FIGS. 5 through 10 illustrate a method for fabricating a large area substrate according to an embodiment of the present disclosure. The method includes formation of a semipolar GaN wafer as shown in FIG. 5. In a certain embodiment, the method includes providing a large-area substrate 110, for example of GaAs. A substrate orientation is selected so that a {111}A surface makes the same angle with respect to the surface as the (0001) Ga surface of GaN makes with respect to the desired semi-polar surface. For example, the (20-21) surface of GaN makes angles of 75.1 with respect to the +c plane and 14.9° with respect to the closest m-plane. The surface orientation of the GaAs surface may be chosen to be within 5° of (1 –1 0.7) or of (1.22 –0.78 0.22). The (10-11) surface of GaN makes angles of 62.0° with respect to the +c plane and 28.0° with respect to the closest m-plane. The surface orientation of the GaAs surface may be chosen to be within 5° of (1 –1 2) or of (1.43 –0.56 0.43). The (11-22) surface of GaN makes an angle of 58.4° with respect to the +c plane and is perpendicular to an m-plane. The surface orientation of the GaAs surface may be chosen to be within 5° of (1 –1 3) or of (3 –1 1). Once the substrate orientation is selected, similar processes such as those described above are used to form the free standing semi-polar gallium and nitrogen containing substrate.

In a specific embodiment, using a deposition process, a mask layer 120, e.g., $SiO_x$ or $SiN_x$, is deposited onto the surface with a thickness of approximately 50 nm-1 micron. The mask is patterned into strips by conventional photolithography, with the edges of the masks lying along the intersection of (111)A surfaces with the large-area surface. The openings between the masks 530 preferably have a width w between about 1 micron and about 10 microns and the pattern has a period L between about 2 microns and about 5000 microns, or preferably between about 5 microns and about 1000 microns. Trenches with (111)A facets 540 are then formed, for example, by wet-etching with a selective etch or other suitable process. In another specific embodiment, the openings between the masks comprise a two-dimensional array of localized openings, for example, with a square, rectangular, hexagonal, or circular shape.

Referring now to FIG. 6 a layer of photoresist material 620 is deposited onto the surface of substrate 110, with a thickness of approximately 50 nm-1 micron. UV exposure 628 is done through a grayscale photomask 624, e.g., HEBS-glass, with a pre-determined electron-beam-developed pattern. The photoresist is developed to form a gray scale pattern 630 with the desired pitch angle. A dry etch, e.g., by RIE or plasma, forms trenches 650 with a pitch angle chosen to provide (111)A facets 540.

Referring now to FIG. 7, in an alternative embodiment, the method uses a patterning process such as inductively-coupled plasma etching. In a specific embodiment, the method deposits a mask 720, e.g., photoresist, $SiO_x$, or $SiN_x$, $SrF_2$, or Ni onto the surface of substrate 110, with a thickness of approximately 50 nm-1 micron, of the exposed surfaces. The surface is patterned into strips or other suitable configuration by conventional photolithography with an array of mask strips with openings 730. Preferably, the method performs an inductively-coupled plasma etching process, using the chemistry, process conditions, and composition and thickness of the mask to vary the angle of the sidewalls of the trenches 750 so as to expose (111)A facets 540 according to a specific embodiment.

A mask layer, e.g., $SiO_x$ or $SiN_x$, is deposited onto the surface, with a thickness of approximately 50 nm-1 micron, by directional deposition 810, e.g., sputtering, ion beam deposition, onto the non-(111)A surfaces, as shown in FIG. 8.

Deposition of a low-temperature nucleation layer and a high-temperature GaN epitaxial layer 230 on the (111)A surfaces by metalorganic chemical vapor deposition (MOCVD) or molecular beam epitaxy (MBE) or other suitable techniques is then performed.

Next, a thick GaN layer 330 is grown by hydride vapor phase epitaxy (HVPE), as shown in FIG. 9. Overall layer thickness is between about 1 micron to about 10 millimeters. A coalescence front 340 may form between separate domains and the edge dislocation density at coalescence fronts may be greater than about $10^2$ cm$^{-1}$ or greater than about $10^3$ cm$^{-1}$ and may be less than about $10^4$ cm$^{-1}$. Some stacking faults 350 may be generated at the (000-1) face of the growing GaN film where it emerges from the openings in the original mask layer 520. The concentration of stacking faults may be greater than about 1 cm$^{-1}$, greater than about 10 cm$^{-1}$, or greater than about 100 cm$^{-1}$, and may be less than about $10^4$ cm$^{-1}$. As shown, the method forms a resulting thickness of gallium and nitrogen containing material in a selected orientation.

Referring now to FIG. 10, the thick gallium and nitrogen material 430 is separated from the GaAs substrate 410. This may be accomplished with dissolution in mineral acids. Other techniques such as laser lift-off, selective etching in a flux, spontaneous stress-induced lift-off, lapping, or the like also may be used. If desired, lapping the backside of free-standing GaN substrate to flatten the backside 440 may be performed. Optionally, the method may lap, polish, chemical-mechanical polish front and/or back surfaces. Once the free standing substrate or wafer 450 has been released and prepared, a device manufacturing process may be performed on the free standing substrate to form one or more devices and, and if desirable, performing other steps, as desired. The free-standing GaN substrate has a wurtzite structure, a semi-polar major surface orientation, and comprises a one- or two-dimensional array of seed regions and coalescence fronts.

Figure 11:
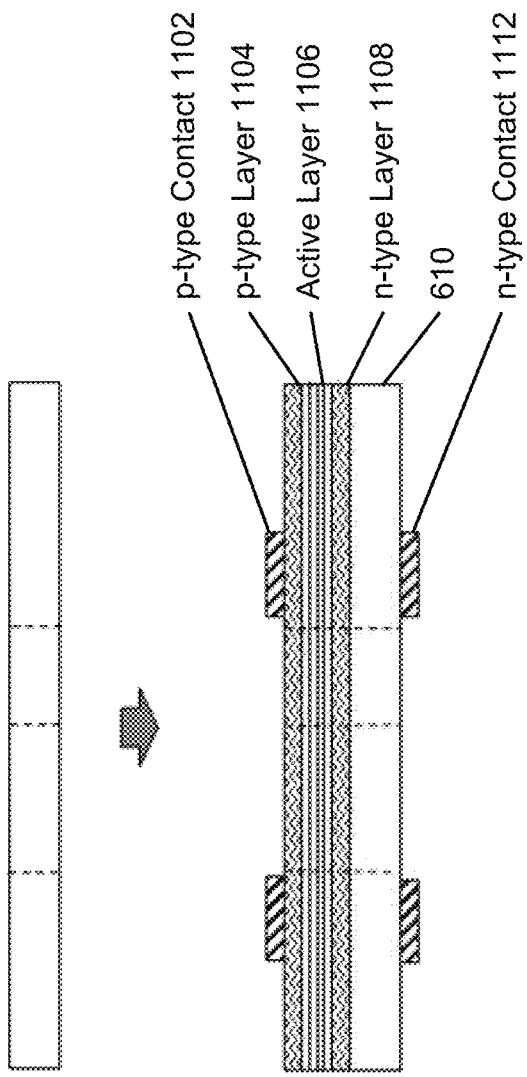
FIGS. 11 through 14 are diagrams illustrating a method and resulting optical devices according to embodiments of the present disclosure.
Figure 12:
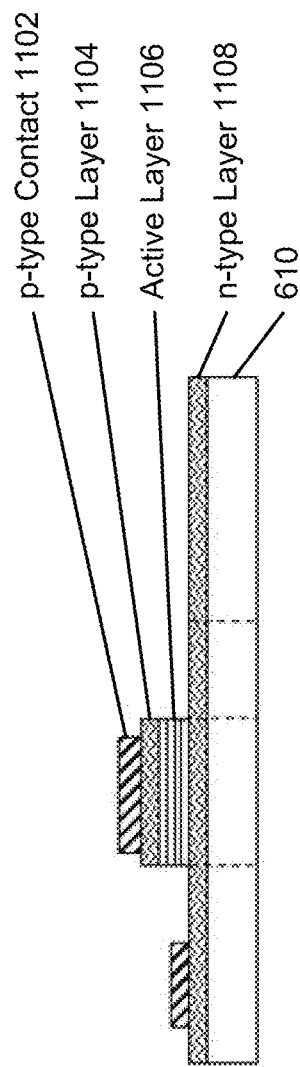

FIGS. 11 and 12 are cross-sectional diagrams illustrating methods and resulting optical devices according to embodiments of the present disclosure. An optical device is formed by a sequence of steps, including the step of epitaxial layer deposition atop a substrate 610 comprising at least one AlInGaN active layer 1106, e.g., by MOCVD. In certain embodiments, the deposited layers include an n-type layer 1108, a doped or unintentionally doped single quantum well (SQW), a multiple quantum well (MQW) structure or double-heterostructure (DH structure), and a p-type layer 1104, as shown. The device structures may be vertical, as illustrated schematically in FIG. 11, or lateral, as illustrated schematically in FIG. 12. The device may be electrically connected to an external circuit to provide a potential between an n-type contact 1112 and a p-type contact 1102.

In a specific embodiment, the method also deposits an n-type contact 1112, and a p-type contact 1102. In some embodiments, at least one of the set of n-type and p-type contacts is placed in specific registry respect to the coalescence fronts and/or the regions containing stacking faults, if present. Contacts may be placed to cover substantially all of the stacking faults in the substrate, if present. The light emission portion may be centered over the coalescence front, or between the coalescence front and a region of stacking faults, if present. In one specific embodiment, transparent p-type contacts are deposited and are placed in such a way that they avoid contact with at least one of coalescence fronts, which may have an elevated concentration of threading dislocations, and regions containing stacking faults. In this way a light-emitting structure may be formed that is substantially free of stacking faults and has a relatively low concentration of threading dislocations. In certain embodiments, a defective region associated with a coalescence front and/or a region of stacking fault is utilized as a shunt path for reducing series resistance. In certain embodiments, n-type contacts are placed above coalescence fronts, with an edge dislocation density above $10^3$ cm$^{-1}$, and/or regions with a concentration of stacking faults above $10^1$ cm$^{-1}$, for example, above seed regions.

Referring now to FIG. 12, in some embodiments, e.g., a laser diode, the p-contact may be placed in a region substantially free of stacking faults and coalescence fronts. A mesa may be formed by conventional lithography and an n-type contact placed in electrical contact with the n-type layer 1108 and/or the substrate 610. As shown in FIG. 12, a device may comprise an n-type layer 1108, an active layer 1106, a p-type layer 1104, and a p-type contact 1102.

Figure 13:
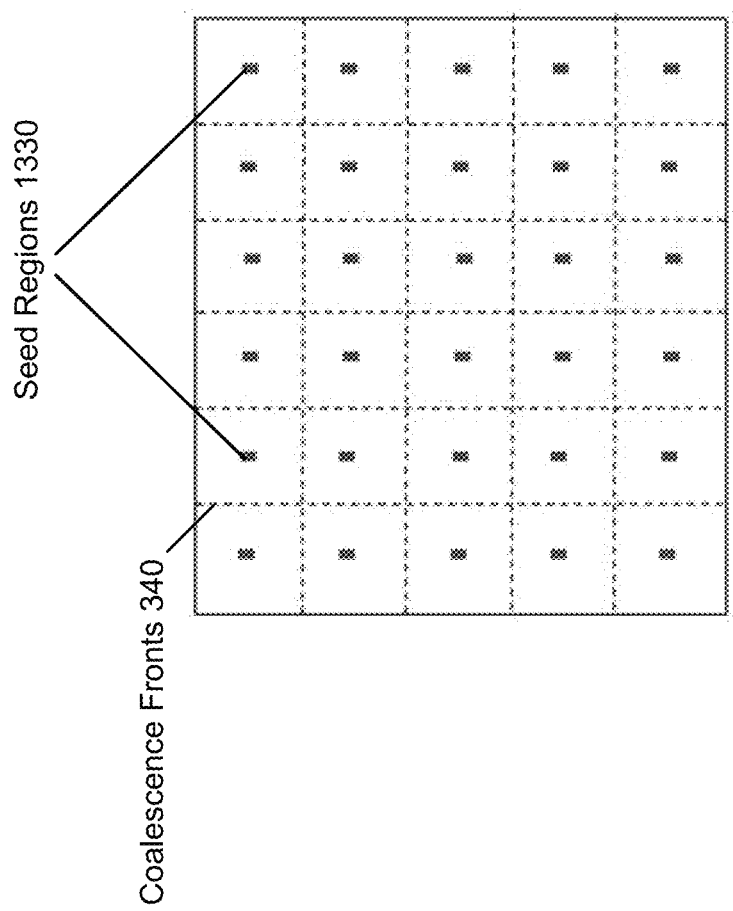

FIG. 13 shows a top view (plan view) of a free-standing GaN substrate formed by etching trenches with exposed (111)A facets in the form of a two-dimensional array. The GaN layer grew through the two-dimensional array of openings in the original mask layer to form seed regions 1330. Coalescence of the GaN layer may form a two-dimensional grid of coalescence fronts 340.

Figure 14A:
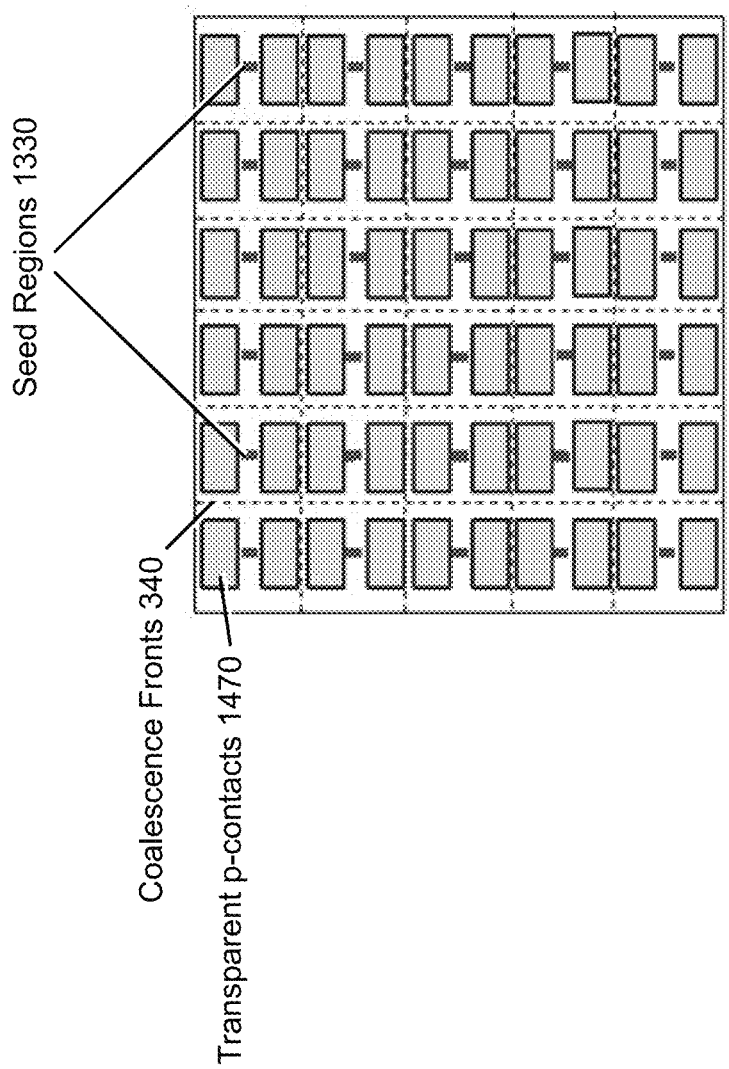
Figure 14B:
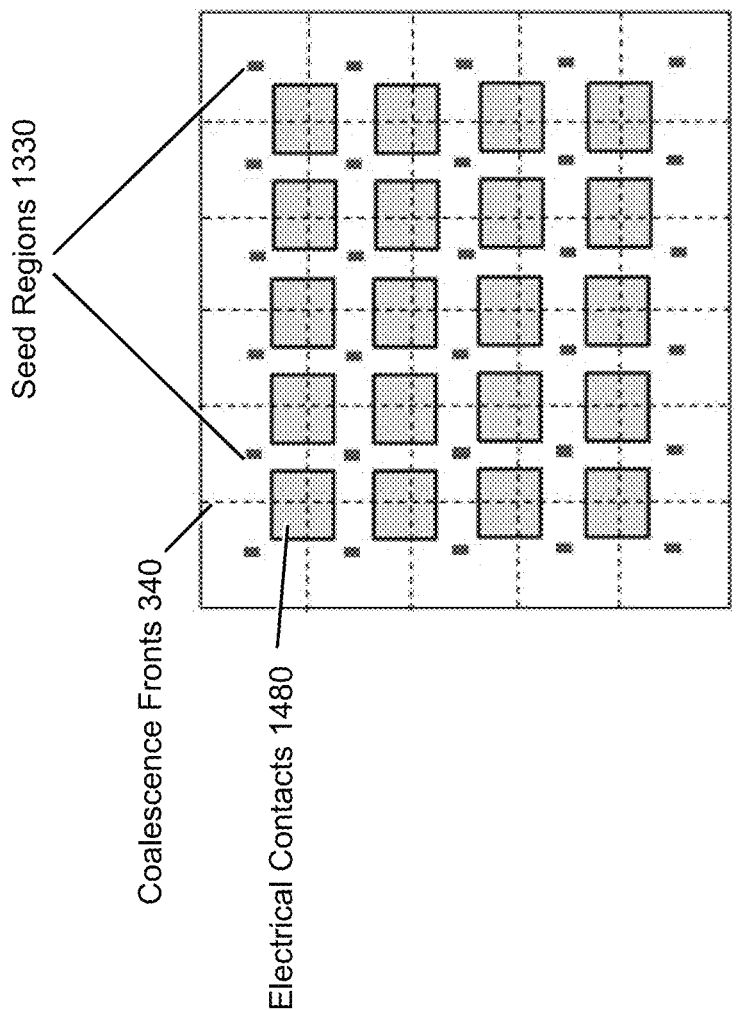
Figure 14C:
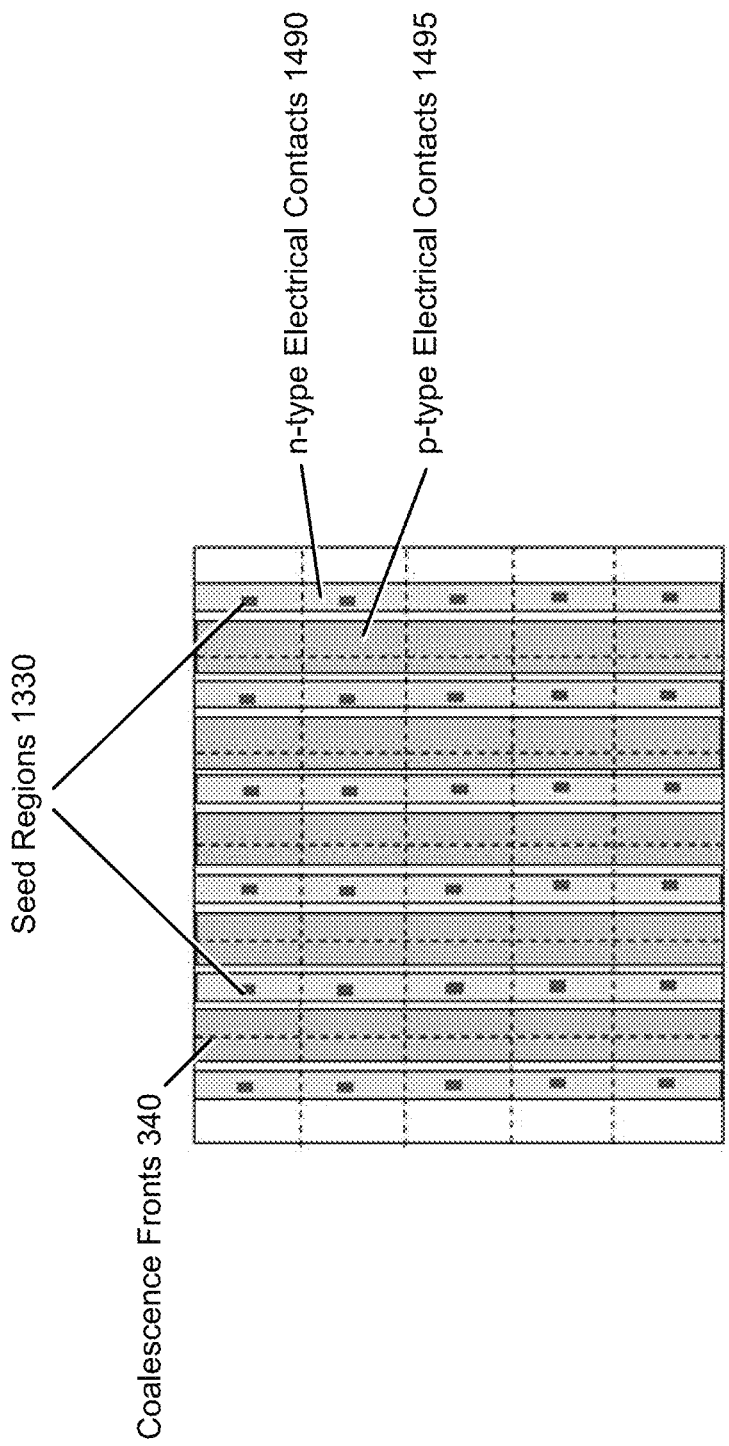

FIG. 14(a) shows a top view of a device structure, for example, of LEDs, where transparent p-contacts 1470 have been aligned with respect and placed so as not to be in contact with either the seed regions 1330 or the coalescence fronts 340. FIG. 14(b) shows a top view of an alternative embodiment of a device structure, for example, of LEDs, where electrical contacts are again aligned with respect to seed regions 1330 and coalescence fronts 340 but now are positioned above coalescence fronts 340. FIG. 14(c) shows a top view of an alternative embodiment of a device structure, for example, of a flip-chip LED, where n-type electrical contacts 1490 are aligned with respect to seed regions 1330 and p-type electrical contacts 1495 are aligned between seed regions 1330.

Individual die, for example, light emitting diodes or laser diodes, may be formed by sawing, cleaving, slicing, singulating, or the like, between adjacent sets of electrical contacts. Referring again to FIG. 14A, slicing may be performed along coalescence fronts 340. Slicing may also be performed through seed regions 1330. Referring now to FIG. 14B, in certain embodiments, slicing may be performed through seed regions 1330 but not along coalescence fronts 340. Referring again to FIG. 14C, in certain embodiments slicing is performed neither through the seed regions 1330 nor along all coalescence fronts 340. Depending on the arrangement of the one- or two-dimensional array of seed regions, the singulated die may have three corners, four corners, or six corners.

The methods described herein provide means for fabricating large-area non-polar and semi-polar gallium-containing nitride substrates, albeit having some potentially defective regions. The methods described herein provide means for fabricating high-performance light emitting diodes and/or laser diodes that avoid potential issues associated with defective regions in the large-area non-polar and semi-polar substrates.

Figure 15:
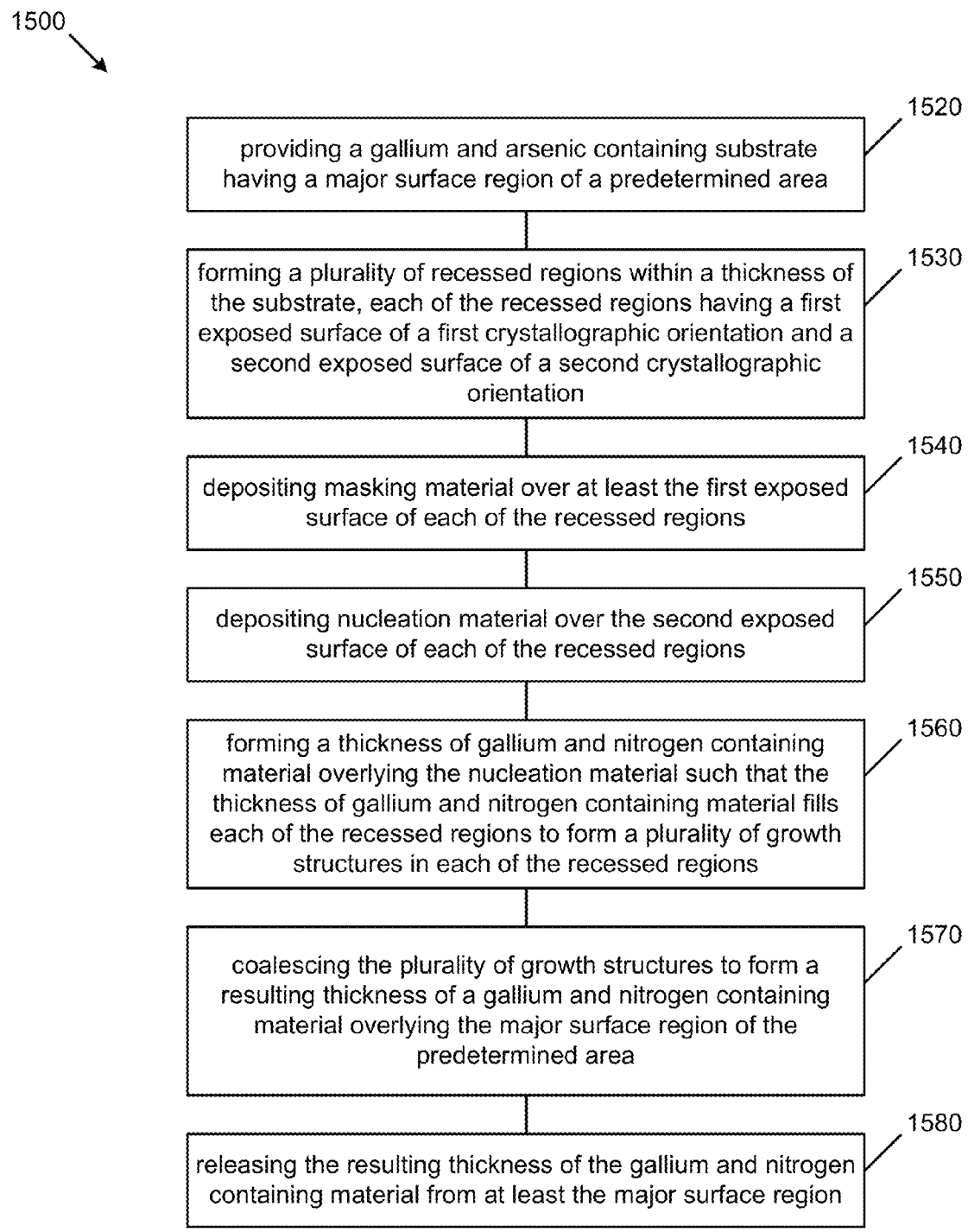
FIGS. 15 and 16 depict steps for practicing method embodiments.

FIG. 15 depicts a block diagram of a system. As an option, the present system 1500 may be implemented in the context of the architecture and functionality of the embodiments described herein. The modules of the system can, individually or in combination, perform method steps within system 1500. Any operations performed within system 1500 may be performed in any order unless as may be specified in the claims. The embodiment of FIG. 15 implements steps to perform: providing a gallium and arsenic containing substrate having a major surface region of a predetermined area (see step 1520);

forming a plurality of recessed regions within a thickness of the substrate, each of the recessed regions having a first exposed surface of a first crystallographic orientation and a second exposed surface of a second crystallographic orientation (see step 1530); depositing masking material over at least the first exposed surface of each of the recessed regions (see step 1540); depositing nucleation material over the second exposed surface of each of the recessed regions (see step 1550); forming a thickness of gallium and nitrogen containing material overlying the nucleation material such that the thickness of gallium and nitrogen containing material fills each of the recessed regions to form a plurality of growth structures in each of the recessed regions (see step 1560); coalescing the plurality of growth structures to form a resulting thickness of a gallium and nitrogen containing material overlying the major surface region of the predetermined area (see step 1570); and releasing the resulting thickness of the gallium and nitrogen containing material from at least the major surface region (see step 1580).

Figure 16:
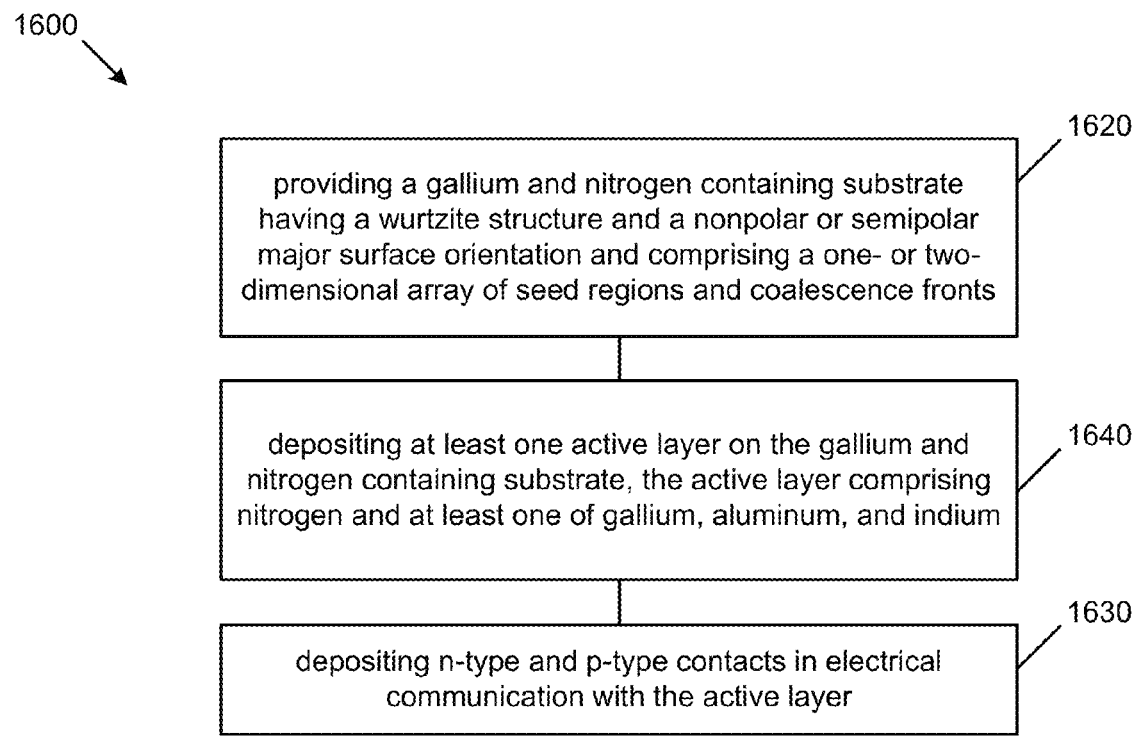

FIG. 16 depicts a block diagram of a system. As an option, the present system 1600 may be implemented in the context of the architecture and functionality of the embodiments described herein. The modules of the system can, individually or in combination, perform method steps within system 1600. Any operations performed within system 1600 may be performed in any order unless as may be specified in the claims. The embodiment of FIG. 16 implements steps to perform: providing a gallium and nitrogen containing substrate having a wurtzite structure and a nonpolar or semipolar major surface orientation and comprising a one- or two-dimensional array of seed regions and coalescence fronts (see step 1620); depositing at least one active layer on the gallium and nitrogen containing substrate, the active layer comprising nitrogen and at least one of gallium, aluminum, and indium (see step 1630); and depositing n-type and p-type contacts in electrical communication with the active layer (see step 1640).

While the above is a description of the specific embodiments, various modifications, alternative constructions and equivalents may be used. Therefore, the above description and illustrations should not be taken as limiting the scope of the appended claims.

What is claimed is:

1. A method for fabricating a gallium and nitrogen containing substrate comprising:
   providing a gallium and arsenic containing substrate having a major surface region of a predetermined area;
   forming a plurality of recessed regions within a thickness of the substrate, each of the plurality of recessed regions having a first exposed surface of a first crystallographic orientation and a second exposed surface of a second crystallographic orientation;
   depositing masking material over at least the first exposed surface of each of the recessed regions;
   depositing nucleation material over the second exposed surface of each of the recessed regions;
   forming a thickness of gallium and nitrogen containing material overlying the nucleation material such that the thickness of gallium and nitrogen containing material fills each of the recessed regions to form a plurality of growth structures in each of the recessed regions;
   coalescing the plurality of growth structures to form a resulting thickness of a gallium and nitrogen containing material overlying the major surface region of the predetermined area; and
   releasing the resulting thickness of the gallium and nitrogen containing material from at least the major surface region.

2. The method of claim 1 wherein the predetermined area is greater than 15 square centimeters and the gallium and arsenic containing substrate is a GaAs wafer.

3. The method of claim 1 wherein the major surface region has an orientation within about 5 degrees of {110}.

4. The method of claim 1 wherein the major surface region has an orientation within about 5 degrees of an orientation chosen from {1 −1 0.7}, {1.22 −0.78 0.22}, {1 −1 2}, {1.43 −0.56 0.43}, {1 −1 3}, and {3 −1 1}.

5. The method of claim 1 wherein the second exposed surface is a non-(111)A surface.

6. The method of claim 1 wherein depositing nucleation material comprises a low-temperature process ranging from about 450 degrees Celsius to about 600 degrees Celsius.

7. The method of claim 1 wherein forming the thickness of gallium and nitrogen containing material comprises a high-temperature GaN epitaxial process selected from metalorganic chemical vapor deposition (MOCVD) and molecular beam epitaxy (MBE).

8. The method of claim 1 wherein the resulting thickness of a gallium and nitrogen containing material is between about 10 microns and about 10 millimeters.

9. The method of claim 1 wherein coalescing comprises forming the resulting gallium and nitrogen containing material by a hydride vapor phase epitaxy (HVPE) process.

10. The method of claim 9 wherein each of growth structures has an edge dislocation density at a coalescence front of less than about $10^4$ $cm^{-2}$.

11. The method of claim 1 wherein a region of the resulting thickness of the gallium and nitrogen containing material has stacking faults with a concentration of less than about $10^4$ $cm^{-1}$.

12. The method of claim 1 further comprising depositing at least one active layer on the gallium and nitrogen containing material, the active layer comprising nitrogen and at least one of gallium, aluminum, and indium.

13. The method of claim 12 wherein the plurality of recessed regions comprises a linear array of recessed regions and electrical contacts are configured so as to provide for light emission from the active layer positioned between the coalescence fronts of the growth structure.

14. The method of claim 12 wherein the plurality of recessed regions comprises a two-dimensional array of recessed regions and electrical contacts are positioned to provide for light emission from the active layer between the coalescence fronts of the growth structure.

15. The method of claim 12 wherein electrical contacts are placed on a defective region, wherein the defective region is a seed region or a region having stacking faults at a concentration of at least $10^1$ $cm^{-1}$.

16. A method for fabricating a light emitting device, comprising:
   providing a gallium and nitrogen containing substrate having a wurtzite structure and a nonpolar or semipolar major surface orientation and comprising a one- or two-dimensional array of seed regions and coalescence fronts;
   depositing at least one active layer on the gallium and nitrogen containing substrate, the active layer comprising nitrogen and at least one of gallium, aluminum, and indium; and
   depositing n-type and p-type contacts capable of conducting electrical current to and from the active layer.

17. The method of claim 16, wherein the coalescence fronts comprise linear arrays of edge dislocations with a line density of at least about $10^2$ $cm^{-1}$.

18. The method of claim 16 wherein the seed regions comprise stacking faults with a concentration greater than 1 $cm^{-1}$.

19. The method of claim 16 wherein the period of the seed regions and coalescence fronts is between about 2 microns and about 5000 microns.

20. The method of claim 16 wherein electrical contacts are placed on a defective region, wherein the defective region is selected from a seed region, a region having coalescence fronts, and a region having stacking faults at a concentration of at least $10^1$ $cm^{-1}$.

* * * * *